United States Patent
Krutsick

(10) Patent No.: US 6,555,852 B1
(45) Date of Patent: Apr. 29, 2003

(54) BIPOLAR TRANSISTOR HAVING AN EMITTER COMPRISED OF A SEMI-INSULATING MATERIAL

(75) Inventor: Thomas J. Krutsick, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/051,937

(22) Filed: Jan. 17, 2002

(51) Int. Cl.[7] .......................................... H01L 31/0328
(52) U.S. Cl. ..................... 257/197; 257/201; 257/565
(58) Field of Search .................... 438/309, 312, 438/314, 317; 257/183, 197, 198, 200, 201, 565, 591, 592

(56) References Cited

U.S. PATENT DOCUMENTS

| | | | | |
|---|---|---|---|---|
| 4,849,799 A | * | 7/1989 | Capasso et al. ............... 257/25 |
| 5,153,693 A | * | 10/1992 | Tsang et al. ................. 257/583 |
| 5,352,912 A | * | 10/1994 | Crabbe et al. ............... 257/198 |
| 5,389,803 A | * | 2/1995 | Mohammad ................. 257/197 |
| 5,684,310 A | * | 11/1997 | Liu ............................. 257/197 |
| 2001/0010389 A1 | * | 8/2001 | Forbes et al. ................ 257/565 |

OTHER PUBLICATIONS

N. O-uchi, H. Hayashi, H. Yamoto and T. Matsushita: "A New Silicon Heterojunction Transistor Using JTHE Doped SIPOS"; 1979 IEEE; 522–524.

* cited by examiner

Primary Examiner—Tuan H. Nguyen

(57) ABSTRACT

The present invention provides a bipolar transistor having a collector located in a semiconductor substrate having a given bandgap, and a base in contact with the collector. The base has a bandgap less than the bandgap of the substrate. In addition, the bipolar transistor further includes an emitter located over the base, where the emitter has a bandgap greater than the bandgap of the substrate. A method of forming a bipolar transistor, and an integrated circuit incorporating the bipolar transistor or the method, are also disclosed.

13 Claims, 4 Drawing Sheets

BIPOLAR TRANSISTOR HAVING AN EMITTER COMPRISED OF A SEMI-INSULATING MATERIAL

TECHNICAL FIELD OF THE INVENTION

The present invention is directed, in general, to semiconductor devices and, more specifically, to a bipolar transistor having an emitter comprised of a semi-insulating material and a method of manufacturing the same.

BACKGROUND OF THE INVENTION

Bipolar technology has been extensively used through the years for applications requiring high speed, high current drive, and low noise. Scaling of semiconductor devices has not only drastically increased the density of integrated circuits, but it has also improved device and circuit performance. This rapid advance in semiconductor technology has placed increasing pressure on the ability of bipolar devices to dominate high-performance applications. Among the primary ways bipolar devices, such as bipolar transistors, may be improved for high-performance applications is to reduce the overall capacitance of the device, for example, between the base and emitter, to arrive at a faster switching device or a higher cutoff frequency. Those skilled in the art understand that decreasing device capacitance can result in an increase in device speed. However, the typically high dopant concentrations implanted into these layers of the device often increase capacitance across the device, for example, across the base and emitter.

Unfortunately, conventional techniques used to decrease this component of device capacitance, and thereby increase device switching speed, are at odds with the additional desire to increase or maintain the current gain of such bipolar devices. More specifically, by reducing the dopant concentrations to be implanted in the device layers, the amount of current gain of a heterojunction bipolar device may also be reduced. As such, reducing the amount of current gain in a heterojunction bipolar device by reduction in emitter doping results in a reduction in device capacitance, and thus an increase in switching speed or cutoff frequency.

As is well known in the art, current gain is exponentially related to the "bandgap" differential of the materials used to form the base and emitter layers in a heterojunction bipolar device. The bandgap for a given material may be broadly described as the minimum energy required to excite electrons within that material sufficient to transfer electrons from the valence band to the conduction band, such that they may contribute to electrical conduction. Typically, insulators have an extremely large bandgap, semi-insulating films have a relatively large bandgap, semiconductors have an average bandgap, and metal conductors have little or no bandgap at all. In a heterojunction device, the larger the differential between the bandgap of a material comprising the base and the bandgap of a material comprising the emitter of a bipolar device, the larger the current gain across the device.

Conventional techniques aimed at increasing overall switching speed for bipolar devices employ this bandgap-current gain relationship. In order to reduce capacitance across the device and typically also allowing the use of reduced dopant concentration levels in the device layers, semiconductor manufacturers attempt to "exchange" some current gain for the reduction in capacitance. More specifically, the bandgap differential between the emitter or base of a bipolar device is increased as much as possible so that some of the current gain achieved may be exchanged for reduced capacitance across the base and emitter. As a result, although not all of the current gain originally achieved is maintained, a portion of it is retained and a portion of it is exchanged for reduced device capacitance and increased device speed by permitting reduced dopant concentration levels in the device layers.

With heterojunction bipolar devices, an increase in bandgap differential in present technology is typically sought by decreasing the bandgap of the base layer. However, recent approaches to increasing switching speed have included increasing the bandgap differential across a typical device by increasing the bandgap of the emitter layer, rather than the bandgap of the base, thus converting the device to a heterojunction bipolar device. However, even these attempts have not increased the bandgap differential between the base and emitter of a bipolar device to arrive at the switching speeds demanded by today's, as well as tomorrow's, semiconductor market.

Many of the conventional techniques attempting to maintain a high current gain while simultaneously increasing device performance have produced relatively disappointing results. Early attempts to achieve current gains high enough to "exchange" for reduced capacitance have employed tunneling insulators sandwiched in between the emitters and bases of bipolar devices. For example, techniques employing silicon dioxide ($SiO_2$) with a polysilicon cap as an emitter material have been successful in achieving barrier heights for holes on the order of 1.0 eV. This increases the gain of the device, however, the dopant concentrations in the polysilicon required to make the emitter resistance adequately low in a bipolar device is about 1E16/cm2. The result is remaining excessive parasitic capacitance across the base and emitter of the device.

Accordingly, what is needed in the art is a bipolar device, and related method of manufacturing, which maintains a high overall current gain with relatively low base-to-emitter capacitance that does not suffer from the deficiencies found in the prior art.

SUMMARY OF THE INVENTION

To address the above-discussed deficiencies of the prior art, the present invention provides a bipolar transistor. In one embodiment, the bipolar transistor includes a collector located in a semiconductor substrate having a given bandgap, and a base in contact with the collector. The base preferably has a bandgap less than the bandgap of the substrate. In addition, the bipolar transistor further includes an emitter located over the base, where the emitter has a bandgap greater than the bandgap of the substrate.

In another aspect of the present invention, a method of manufacturing a bipolar transistor is disclosed. In one particular embodiment, the method includes depositing a collector in a semiconductor substrate having a given bandgap, and creating a base in contact with the collector. The base preferably has a bandgap less than the bandgap of the substrate. The method further includes forming an emitter having a bandgap greater than the bandgap of the substrate over the base.

In yet another aspect of the present invention, an integrated circuit is disclosed. In one embodiment, the integrated circuit includes passive devices formed over a semiconductor substrate having a given bandgap, as well as interlevel dielectric layers. In addition, the integrated circuit includes a bipolar transistor having a collector located in the substrate and a base in contact with the collector. The base has a bandgap less than the bandgap of the substrate. The bipolar device further includes an emitter, having a bandgap greater than the bandgap of the substrate, located over the base. The integrated circuit further includes interconnections, created in the dielectric layers, connecting the passive devices and the bipolar transistor to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying Figures. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
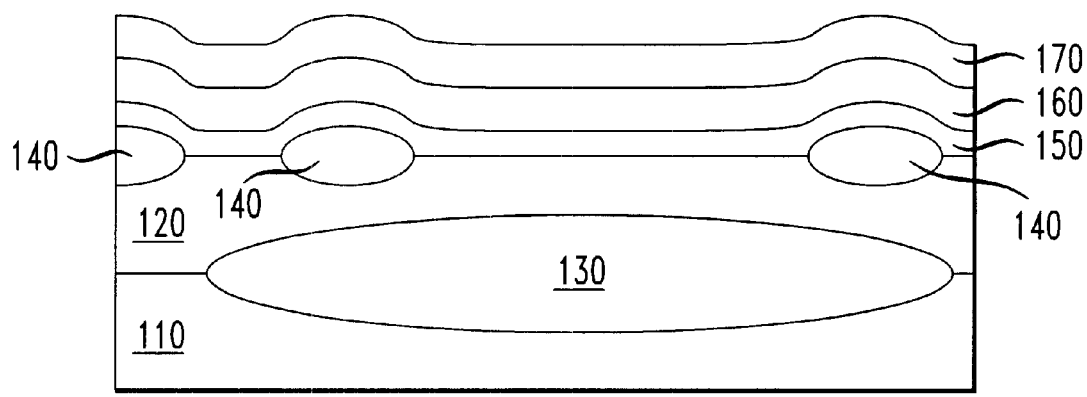
FIG. 1 illustrates one embodiment of an initial bipolar device early in a manufacturing process carried out according to the present invention.

Referring initially to FIG. 1, illustrated is one embodiment of an initial bipolar device 100 covered by the present invention, early in a manufacturing process. As illustrated at this point of manufacture, the device 100 is formed over a semiconductor substrate 110 having a given bandgap. In an advantageous embodiment, the substrate 110 is comprised of silicon (Si), however other suitable semiconductor substrate materials may also be employed.

A conventional epitaxial (epi) layer 120 is located over the substrate 110. The epi layer 120 may be conventionally doped with either an N-type dopant or P-type dopant to form either an NPN or PNP device. Formed in the epi layer 120 is a collector 130 of the device 100. In the illustrated embodiment, the collector 130 may be conventionally formed with implantation processes known to those skilled in the art. In addition, conventional isolation structures 140, such as field oxides (FOXs) or trench isolation structures, are located at the ends of the collector 130.

A first oxide layer 150, such as a gate oxide or thermal oxide, is grown over the epi layer 120 as illustrated. Deposited over the first oxide layer 150 is a first polysilicon layer 160. The first polysilicon layer 160 is a "base polysilicon" and will be used later to form a base contact for the device 100, as discussed in detail below. Deposited over the first polysilicon layer 160 is a nitride layer 170. The nitride layer 170 will be used later in the manufacturing process during etching of the device 100. It should be noted that these same deposition layers may also be deposited over regions of the substrate on which CMOS or other devices may be built.

Figure 2:
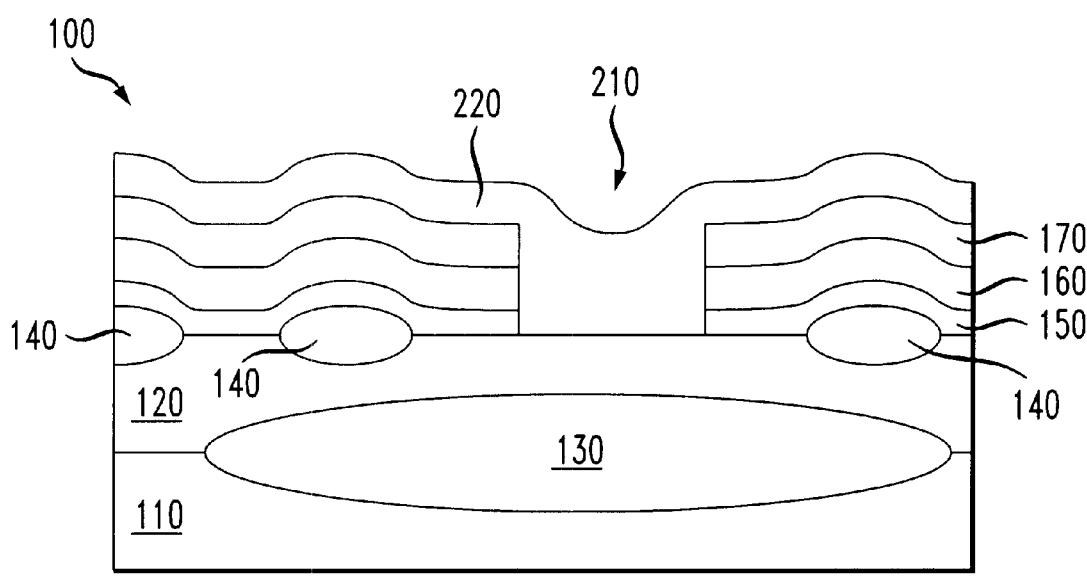
FIG. 2 illustrates the initial bipolar device of FIG. 1 later in a manufacturing process according to the principles of the present invention.

Turning now to FIG. 2, illustrated is the initial bipolar device 100 of FIG. 1 later in a manufacturing process. As shown, an opening 210, which had been conventionally formed through the various deposited layers and down to the epi layer 120, has been conventionally filled with a second oxide layer 220. A conventional anisotropic etch is conducted to form oxide spacers 310 within the opening 210, as shown in FIG. 3.

Figure 3:
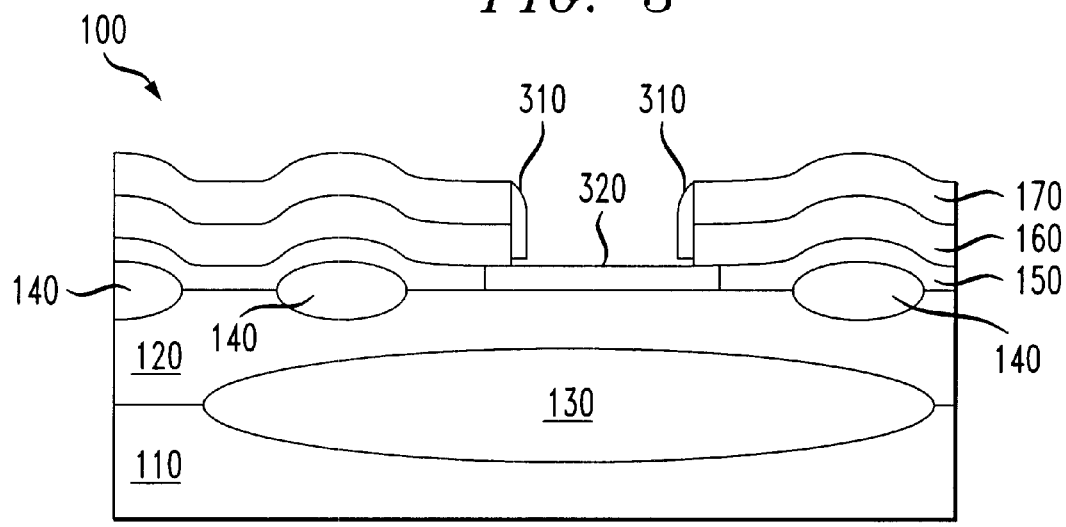
FIG. 3 illustrates the initial bipolar device of FIG. 1 during the formation of a base.
Figure 4:
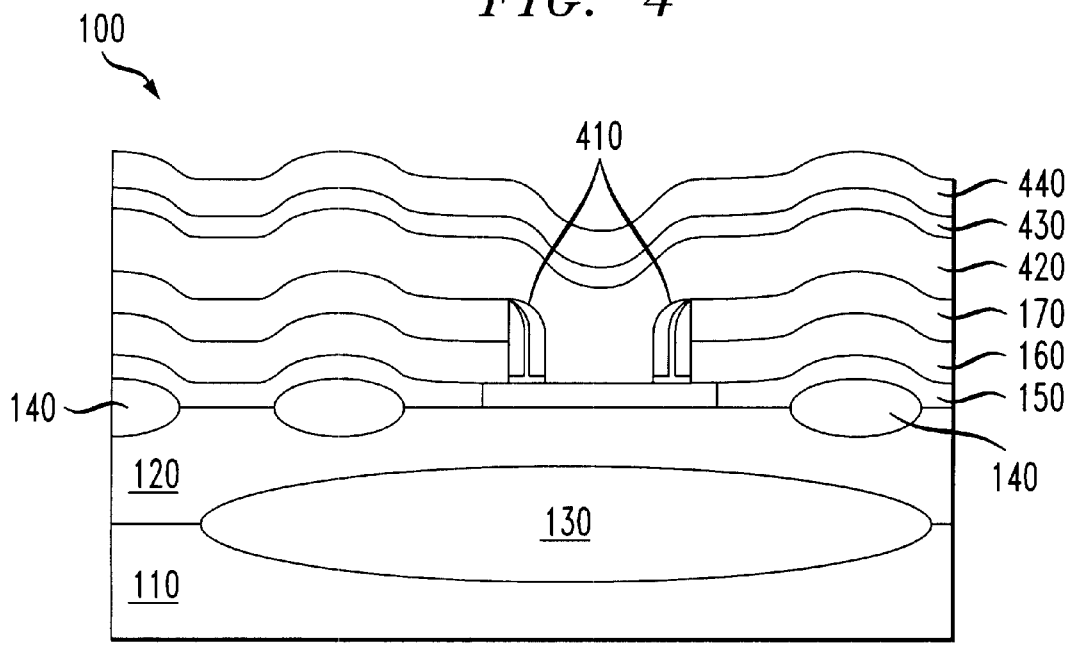
FIG. 4 illustrates the initial bipolar device of FIG. 1 early in the formation of an emitter.

With continued reference to FIG. 3, after the formations of the oxide spacers 310, which will eventually become conventional composite spacers, as shown in FIG. 4, a base 320 is conventionally grown over the epi layer 120 and under a portion of the first polysilicon layer 160, typically using a selective epitaxial deposition. In accordance with the principles of the present invention, the base 320 preferably has a bandgap lower than that of the substrate 110. In one exemplary embodiment, the base 320 is located over the collector 130 such that an electrical current may pass therethrough. In other embodiments, the base 320 may be created within the collector 130, rather than being grown over it or on it. Those skilled in the art are familiar with the various structures the device 100 may have, and the present invention is not limited to any particular one.

In an exemplary embodiment, the base 320 is comprised of silicon germanium (SiGe) and is formed using conventional techniques. In those embodiments where the base 320 is comprised of SiGe, the base 320 may have a bandgap of about 1.0 eV, however still less than a bandgap of the substrate 110. In accordance with conventional practice, a SiGe base 320 having a 1.0 eV bandgap may be formed using a dopant concentration of at least about $1E18/cm^2$. In a more specific embodiment, a SiGe base 320 having a 1.0 eV bandgap may typically have a dopant concentration ranging from about $1E19/cm^2$ to about $4E18/cm^2$.

Referring now to FIG. 4, illustrated is the initial bipolar device 100 of FIG. 1 early in the formation of an emitter. As shown, composite spacers 410 are first completed, in accordance with conventional techniques. In accordance with the principles of the present invention, an emitter for the device 100 is formed having a bandgap greater than the bandgap of the substrate 110. Preferably, the emitter has a bandgap greater than that of the substrate 110, while the substrate 110 has a bandgap greater than the bandgap of the base 320.

To achieve the desired bandgap relationship just described, the emitter may be formed from a semi-insulating material 420 that is deposited over the entire device 100. In one advantageous embodiment, the semi-insulating material provides a bandgap for the emitter of at least about 1.5 eV. For example, the semi-insulating material may be a material that includes silicon oxide therein, and oxygen ($O_2$) at an atomic weight percent of about 26% that provides a bandgap of at least about 1.5 eV. In another example, the semi-insulating material may be a semi-insulating polysilicon (SIPOS) comprised of a mixture of silicon crystallites, amorphous silicon, and silicon dioxide. In yet another embodiment, the semi-insulating material may be a hydrogenated silicon having a comparable bandgap of at least about 1.5 eV. The semi-insulating material 420 is discussed in further detail below, with reference to FIG. 5.

Over the semi-insulating material 420, a second polysilicon layer 430 is deposited. The second polysilicon layer 430 will be used to form an emitter contact for the device 100. A third oxide layer 440 is then deposited over the second polysilicon layer 430. The third oxide layer 440 is used during the etching of the emitter and emitter contact of the device 100.

Figure 5:
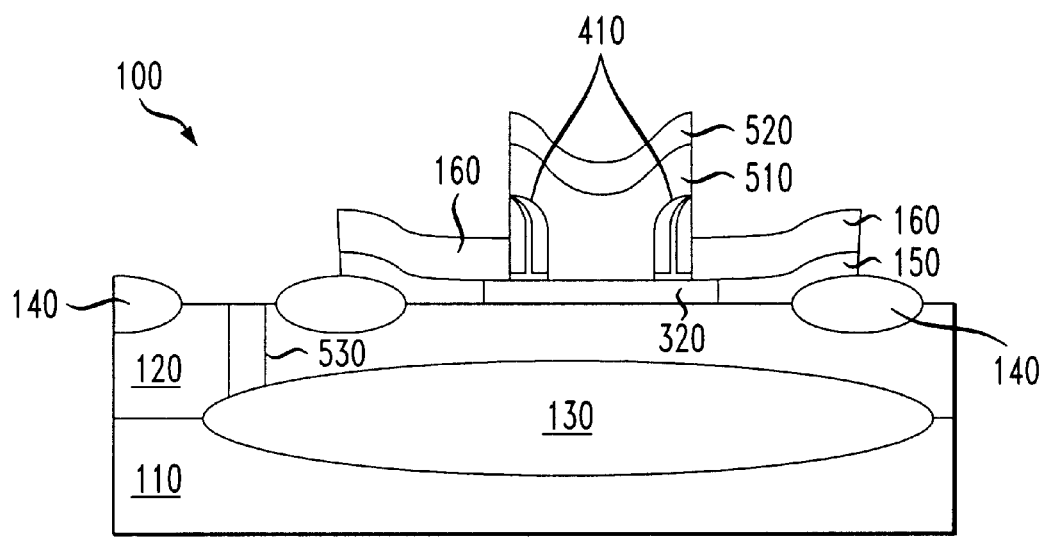
FIG. 5 illustrates the initial bipolar device of FIG. 1 after etching has been performed to define a shape of the device.

Referring now to FIG. 5, illustrated is the initial bipolar device 100 of FIG. 1 after etching has been performed to define a shape of the device 100. More specifically, an emitter 510 is formed over the base 320 by etching the semi-insulating material 420, the second polysilicon layer 430 and the third oxide layer 440. In an advantageous embodiment, a hydrofluoric (HF) etch is performed, however other etches are within the scope of the present invention. In addition, the entire third oxide layer 440 is etched away during this step of the process.

Through the above-discussed etching process, the emitter 510, as well as an emitter contact 520 formed from the second polysilicon layer 430, are given a defined final shape, as shown in FIG. 5. In accordance with conventional practice, the emitter contact 520 is in electrical contact with the emitter 510, and is also used to interconnect the device 100, once finished, with other devices in a circuit. In an exemplary embodiment, the emitter contact 520 and the emitter 510 may be formed in-situ. In such an embodiment, the emitter 510 may be formed to a thickness of about 100 nm, while the emitter contact 520 may be formed to a thickness of about 200 nm. Both layers may then be doped together at about $1E14/cm^2$, as discussed in detail above. To complete the etching at this stage of the manufacturing process, the first oxide layer 150 and the first polysilicon layer 160 are also etched to reveal a portion of the epi layer 120. A collector contact 530 is then formed in an exposed area of the epi layer 120, in accordance with conventionally photolithographic and implantation techniques.

As mentioned above, the emitter 510 may be comprised of a semi-insulating material that has a bandgap larger than that of the substrate 110, which in turn has a bandgap larger than that of the base 320. In an advantageous embodiment, the semi-insulating material comprising the emitter 510 is preferably a SIPOS material and has a bandgap of at least about 1.5 eV when a dopant concentration of about $1E14/cm^2$ or less is implanted into the material. In alternative embodiments, the semi-insulating material may be a hydrogenated silicon having a comparable minimum bandgap, in accordance with the principles discussed herein. In embodiments where the semi-insulating material is SIPOS, the SIPOS may be deposited using a silane nitrous oxide gas with a ratio of 5 parts silane to 1 part nitrous. The SIPOS may be deposited within a pressure ranging from about 400 mTorr to about 700 mTorr, and at a temperature ranging from about 600° C. to about 650° C. The SIPOS may then be annealed at a temperature of about 900° C. for about 1 hour to reduce its sheet resistance. Notwithstanding the deposition process employed, the semi-insulating material forming the emitter 510 preferably has a bandgap greater than that of the substrate 110, which in turn has a bandgap greater than the bandgap of the base 320. As a result, the semi-insulating material may be used in a heterojunction device, for example a heterojunction bipolar transistor, to form an emitter 510 with a dopant concentration significantly less than that of the base 320.

As illustrated in FIG. 5, in an advantageous embodiment where the SiGe base 320 has a bandgap of about 1.0 eV and the emitter 510 has a bandgap of about 1.5 eV (and the silicon substrate 110 has a bandgap of about 1.1 eV), the present invention enjoys substantial utility in that a bandgap differential of about 0.5 eV is maintained between the base 320 and the emitter 510. Those skilled in the art understand the relationship between bandgap differential and current gain, as well as the high current gain achievable by such a device.

Figure 6:
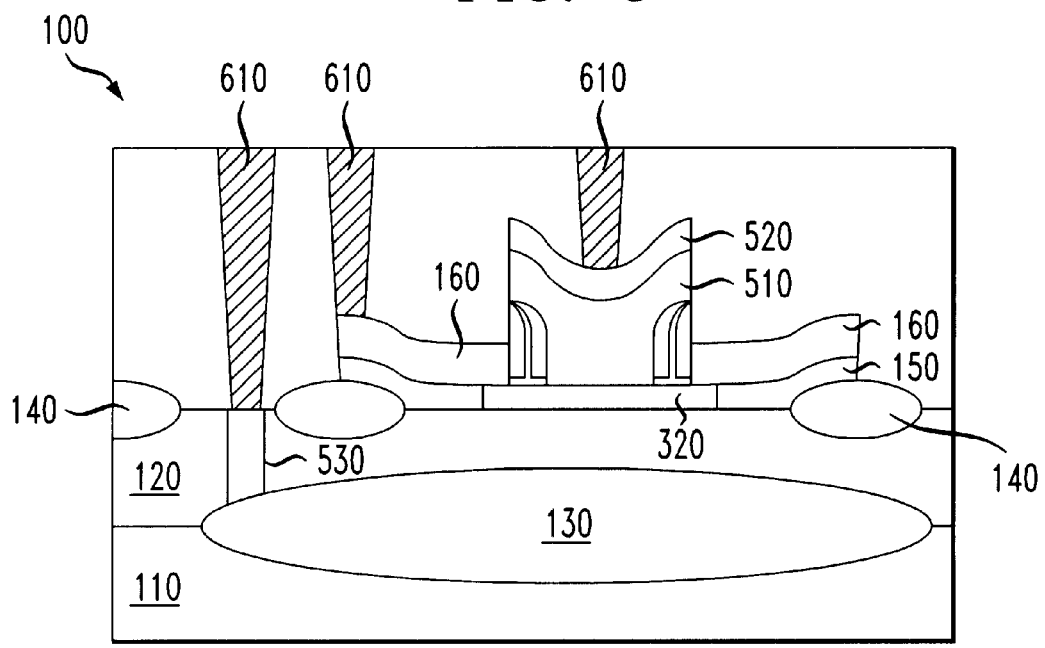
FIG. 6 illustrates a completed bipolar transistor manufactured in accordance with the present invention.

Turning now to FIG. 6, illustrated is a completed bipolar transistor 600 manufactured in accordance with the present invention. The transistor includes the finished emitter 510, emitter contact 520, and collector contact 530 manufactured according to the principles described herein. Also illustrated are electrical interconnects 610 in contact with the emitter contact 520 and the collector contact 530, as well as the first polysilicon layer 160 forming the base contact of the transistor 600. As is well known in the art, the interconnects 610 may be used to electrically connect the transistor 600 of the present invention with other devices within a circuit. Once the transistor 600 has been completed, other components near by or in connection with the transistor 600 may also be completed to form an operative integrated circuit.

As mentioned above, while achieving a substantial current gain as a function of such a large bandgap differential between the base 320 and the emitter 510, the dopant concentration level of the emitter 510 of the present invention remains significantly lower than those found in prior art devices. Due to this differential, the present invention provides a device with a reduction in parasitic capacitance across the overall transistor 600. In addition, since excessive dopant levels can reduce desirable current gain, as may be seen in the prior art, the current gain of the transistor 600 is further maintained above devices found in the prior art. As a result, by employing a semi-insulating material according to the present invention for use in forming the emitter 510 of the transistor 600, a high current gain may be maintained without the risk of lowering that current gain with the excessive levels of dopant implantation typically done in prior art devices, while maintaining a relatively low parasitic capacitance across the emitter 510 and the base 320.

Although an exemplary deposition process for forming the emitter 510 using a semi-insulating material according to the present invention has been described, it must be noted that the described process is for illustrative purposes only and is not intended to limit the scope of the present invention.

As disclosed herein, the present invention provides a bipolar device that has a large bandgap differential between its base and emitter wherein the bandgap of the base is less than that of the substrate on which the device is formed and the bandgap of the emitter is greater than that of the substrate. The present invention is particularly useful with existing heterojunction devices to further increase the bandgap of the emitters in such devices, and therefore further increase their current gains, so as to have more current to exchange for lower capacitance across the devices. In addition, a device manufactured according to the present invention can maintain such high current gains by requiring lower dopant concentrations than typically used in the prior art to facilitate electrical conduction. As such, the present invention provides several benefits over the prior art. For instance, the present invention provides for a higher final current gain that is not reduced by the relatively low concentration of dopant required, than devices found in the prior art.

While some devices found in the prior art may have been capable of achieving current gains as high as those achievable with the present invention, that gain was often significantly reduced once implanting of the high dopant concentration required for electrical conduction in the material used to achieve that high current gain took place. A high final current gain, coupled with low dopant concentrations (and therefore low device capacitance) provides a more efficient device. Moreover, a bipolar device manufactured according to the present invention is employable in almost any integrated circuit, while retaining benefits such as those described above. Examples of other devices in which the present invention may be employed include, but are not limited to, double heterojunction and abrupt or graded junction bipolar devices, as well as bipolar devices having a graded base.

Figure 7:
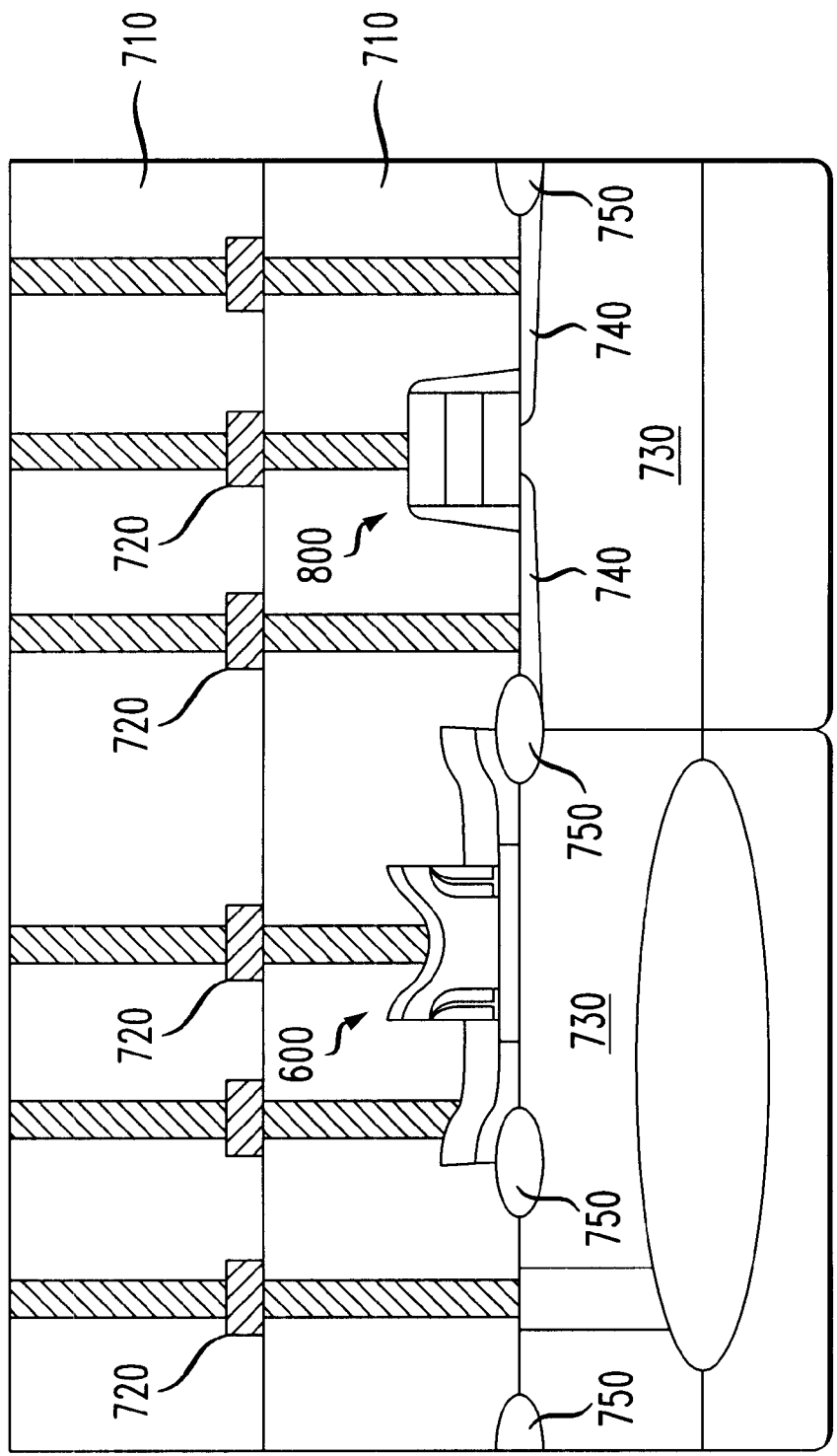
FIG. 7 illustrates an integrated circuit which may incorporate the completed bipolar transistor of FIG. 6.

Turning finally to FIG. 7, illustrated is a sectional view of an integrated circuit 700 which may incorporate the completed bipolar transistor of FIG. 6. The IC 700 also includes a metal-oxide semiconductor (MOS) transistor 800 for use with the bipolar transistor 600. Alternatively, BiCMOS devices, other bipolar devices, or other types of active devices, such as optoelectronic devices, may be included in the IC 700, in addition to or in place of the MOS transistor 800. The IC 700 may further include passive devices such as inductors or resistors, or it may include optical devices or optoelectronic devices. Those skilled in the art are familiar with these various types of device, their manufacture, and the benefits of their incorporation into an IC.

In the embodiment illustrated in FIG. 7, interlevel dielectric layers 710 are deposited over the transistors 600, 800. In one embodiment, the dielectric layers 710 by be formed from $SiO_2$ or BPOS glass, however the present invention is not so limited. Interconnect structures 720 are formed in the interlevel dielectric layers 710 to form interconnections between the various components therein, including the bipolar and MOS transistors 600, 800, to form an operative integrated circuit. In addition, the interconnect structures 720 may also connect the transistors 600, 800 to other areas or components of the IC 700. Those skilled in the art understand how to connect these various devices and components together to form an operative integrated circuit. Also illustrated are conventionally formed tubs 730, as well as source/drain regions 740 formed for the MOS transistor 800. The illustrated individual components are also shown separated by conventional field oxide regions 750.

Of course, use of the bipolar transistor 600 manufactured according to the principles of the present invention is not limited to the manufacture of the particular IC 700 illustrated in FIG. 7. In fact, the present invention is broad enough to encompass the manufacture of any type of integrated circuit formed on a semiconductor wafer which would benefit from the semi-insulating material comprising the emitter formed therein, as provided by the present invention. In addition, the present invention is broad enough to encompass integrated circuits having greater or fewer components than illustrated in the IC 700. Beneficially, each time the present invention is employed to form part or all of a bipolar device in the IC 700, significant increases in switching speeds and cutoff frequency, by the increase in bandgap differential and the corresponding decrease in dopant concentration (together producing and maintaining a high current gain), may be obtained, as discussed in detail above.

Although the present invention has been described in detail, those skilled in the art should understand that they can make various changes, substitutions and alterations herein without departing from the spirit and scope of the invention in its broadest form.

What is claimed is:

1. A bipolar transistor, comprising:
   a collector located in a semiconductor substrate having a given bandgap;
   a base in contact with the collector, the base having a bandgap less than the bandgap of the substrate; and
   an emitter located over the base and having a bandgap greater than the bandgap of the substrate.

2. The bipolar transistor as recited in claim 1 wherein the emitter comprises a semi-insulating material having silicon oxide wherein an atomic weight percent of the oxygen is about 26%.

3. The bipolar transistor as recited in claim 2 wherein the semi-insulating material includes oxygenated silicon deposited in a silane nitrous oxide gas within a pressure ranging from about 400 mTorr to about 700 mTorr, at a temperature ranging from about 600° C. to about 650° C., and wherein the oxygenated silicon is annealed at a temperature of about 900° C. for about 1 hour.

4. The bipolar transistor as recited in claim 1 wherein the emitter comprises a semi-insulating material having hydrogenated silicon.

5. The bipolar transistor as recited in claim 1 wherein the base includes a first dopant concentration and the emitter includes a second dopant concentration that is less than the first dopant concentration and wherein the base and emitter have a bandgap differential that is at least about 0.5 eV or greater.

6. The bipolar transistor as recited in claim 5 wherein the second dopant concentration is about $1E16/cm^2$ or less, and the first dopant concentration is at least about $1E18/cm^2$.

7. The bipolar transistor as recited in claim 1 wherein the base has a bandgap of about 1.0 eV and the emitter has a bandgap of about 1.5 eV.

8. An Integrated Circuit, comprising:
   passive devices formed over a substrate;
   dielectric layers;
   a bipolar transistor, including:
      a collector located in a semiconductor substrate having a given bandgap;
      a base in contact with the collector, the base having a bandgap less than the bandgap of the substrate; and
      an emitter located over the base and having a bandgap greater than the bandgap of the substrate; and
   interconnections, created in the dielectric layers, connecting the passive devices and the bipolar transistor to form an operative integrated circuit.

9. The integrated circuit as recited in claim 8 wherein the emitter comprises a semi-insulating material having silicon oxide wherein an atomic weight percent of the oxygen is about 26%.

10. The integrated circuit as recited in claim 9 wherein the semi-insulating material includes oxygenated silicon deposited in a silane nitrous oxide gas within a pressure ranging from about 400 mTorr to about 700 mTorr, at a temperature ranging from about 600° C. to about 650° C., and wherein the oxygenated silicon is annealed at a temperature of about 900° C. for about 1 hour.

11. The integrated circuit as recited in claim 8 wherein the emitter comprises a semi-insulating material having hydrogenated silicon.

12. The integrated circuit as recited in claim 8 wherein the base includes a first dopant concentration and the emitter includes a second dopant concentration that is less than the first dopant concentration and wherein the base and emitter have a bandgap differential that is at least about 0.5 eV or greater.

13. The integrated circuit as recited in claim 12 wherein the second dopant concentration is about $1E16/cm^2$ or less and the emitter includes a bandgap of about 1.5 eV, and where the first dopant concentration is at least about $1E18/cm^2$ and the base includes a bandgap of about 1.0 eV.

* * * * *